United States Patent
Im et al.

(10) Patent No.: US 8,975,007 B2
(45) Date of Patent: Mar. 10, 2015

(54) METHOD OF FORMING POLYMER NANOFIBER METAL-NANOPARTICLE COMPOSITE PATTERN

(71) Applicants: Samsung Electronics Co., Ltd., Suwon-si (KR); Industry-Academic Cooperation Foundation, Yonsei University, Seoul (KR)

(72) Inventors: Jung-kyun Im, Yongin-si (KR); Min-woo Park, Seoul (KR); Jong-jin Park, Hwaseong-si (KR); Un-yong Jeong, Seoul (KR)

(73) Assignees: Samsung Electronics Co., Ltd., Suwon-Si (KR); Industry-Academic Cooperation Foundation, Yonsei University, Seoul (KR)

( * ) Notice: Subject to any disclaimer, the term of this patent is extended or adjusted under 35 U.S.C. 154(b) by 0 days.

(21) Appl. No.: 14/274,832

(22) Filed: May 12, 2014

(65) Prior Publication Data
US 2014/0335459 A1   Nov. 13, 2014

(30) Foreign Application Priority Data

May 10, 2013   (KR) .................. 10-2013-0053392

(51) Int. Cl.
G03F 7/26   (2006.01)
G03F 7/16   (2006.01)
G03F 7/20   (2006.01)

(52) U.S. Cl.
CPC ... *G03F 7/16* (2013.01); *G03F 7/20* (2013.01)
USPC .................. 430/325; 430/322; 430/330

(58) Field of Classification Search
USPC ......................... 430/322, 325, 330
See application file for complete search history.

(56) References Cited

U.S. PATENT DOCUMENTS

| | | | |
|---|---|---|---|
| 6,712,997 B2 * | 3/2004 | Won et al. | ............ 252/503 |
| 2009/0261035 A1 | 10/2009 | Arora et al. | |
| 2012/0086154 A1 | 4/2012 | Lennhoff | |
| 2013/0020716 A1 | 1/2013 | Kuczynski et al. | |

FOREIGN PATENT DOCUMENTS

| | | |
|---|---|---|
| KR | 10-0867402 B1 | 11/2008 |
| KR | 10-2011-0028019 A | 3/2011 |
| KR | 10-2011-0079139 A | 7/2011 |

* cited by examiner

*Primary Examiner* — Caleen Sullivan
(74) *Attorney, Agent, or Firm* — Sughrue Mion, PLLC

(57) ABSTRACT

A method of forming a polymer nanofiber-metal nanoparticle composite pattern includes forming on a substrate a polymer nanofiber layer comprising polymer nanofibers made from polymers including a heteroaryl group; selectively exposing to UV-ozone a part of the polymer nanofiber layer through an aperture of a mask; selectively removing a part of the polymer nanofiber layer which was not exposed to UV-ozone from the polymer nanofiber layer to form a polymer nanofiber layer pattern; depositing a metal precursor on the polymer nanofiber layer pattern; and reducing the metal precursor into a metal.

20 Claims, 8 Drawing Sheets
(1 of 8 Drawing Sheet(s) Filed in Color)

# METHOD OF FORMING POLYMER NANOFIBER METAL-NANOPARTICLE COMPOSITE PATTERN

CROSS-REFERENCE TO RELATED APPLICATIONS

This application claims priority from Korean Patent Application No. 10-2013-0053392, filed on May 10, 2013 in the Korean Intellectual Property Office, the disclosure of which is incorporated by reference herein in its entirety.

BACKGROUND

1. Field

Methods consistent with the present disclosure relate forming a polymer nanofiber-metal nanoparticle composite pattern.

2. Description of the Related Art

To date, the manufacture of electrospun nanofibers has mostly focused on producing them in bulky nanofiber mats. Recently, however, the use of electrospun nanofibers has been expanded into areas such as electronic devices and ordered cell cultures, which require patterning the electrospun nanofibers.

Various methods to manufacture patterned nanofiber mats have been suggested. For example, the nanofibers may be collected into an arranged form via the application of an electric field to a collector or by using a roller type collector. However, only millimeter sized patterned nanofibers can be obtained by this method. Recently, a method using near field electrospinning was introduced. In this method, individual nanofibers can be controlled, but the method is not suitable for large scale production of nanofibers.

In order to improve the conductivity of nanofibers used in electronic devices and the like, polymer nanofiber-conductive nanoparticle composites in which conductive nanoparticles, such as metal nanoparticles, are present in the polymer fiber may be used. Accordingly, there is a need for a method of forming polymer nanofiber-conductive nanoparticle composites in a nano-sized or micro-sized pattern.

SUMMARY

Exemplary embodiments provide methods for forming a polymer nanofiber-metal nanoparticle composite pattern.

The method of forming a polymer nanofiber-metal nanoparticle composite pattern may include: forming on a substrate a polymer nanofiber layer comprising polymer nanofibers made from polymers including a heteroaryl group; selectively exposing to UV-ozone a part of the polymer nanofiber layer through an aperture of a mask; selectively removing a part of the polymer nanofiber layer which was not exposed to UV-ozone from the polymer nanofiber layer to form a polymer nanofiber layer pattern; depositing a metal precursor on the polymer nanofiber layer pattern; and reducing the metal precursor into a metal.

The heteroaryl group may include a nitrogen atom.

The polymers having a hetero aryl group may include poly(4-vinylpyridine), poly(2-vinylpyridine), poly(4-vinylpyridinium) salt, poly(2-vinylpyridinium) salt, poly(4-vinyl-2-methylpyridine), or poly(2-vinyl-4-methylpyridine).

The polymer nanofiber may be an elastomeric polymer.

The polymer nanofiber layer may be formed by electrospinning, wet spinning, melt spinning, or solvent spinning.

The diameter of the polymer nanofiber may be in the range of about 1 nm to about 1 μm.

The part of the polymer nanofiber layer that is exposed to the UV-ozone and becomes oxidized by the UV-ozone treatment may include a hetero ring having a carbonyl group.

The removing of the parts which are not exposed to UV-ozone from the polymer nanofiber layer may include selectively dissolving the parts which are not exposed to UV-ozone in a solvent, wherein the solvent may include alcohol.

The depositing of the metal precursor on the polymer nanofiber layer pattern may include: forming a metal precursor solution by dissolving the metal precursor in a solvent; and immersing the polymer nanofiber layer pattern into the metal precursor solution, or coating the metal precursor solution on the polymer nanofiber layer pattern.

The metal precursor may include $AgNO_3$, $AgCl$, $HAuCl_4$, $CuCl_2$, $PtCl_2$, $PtCl_4$ or $PdCl_2$.

The metal precursor may form a complex ion with a polymer in the polymer nanofiber layer, wherein the metal precursor binds to a nitrogen atom in the polymer.

The reducing agent may include hydrazine, hydrazine hydrate, sodium borohydride, formic acid, oxalic acid, ascorbic acid, or lithium aluminum hydride.

The method may further include heat treatment after depositing a metal precursor on the polymer nanofiber layer pattern and reducing the metal precursor into a metal.

The heat treatment may be performed between about 100° C. and about 140° C.

BRIEF DESCRIPTION OF THE DRAWINGS

The patent or application file contains at least one drawing executed in color. Copies of this patent or patent application publication with color drawing(s) will be provided by the Office upon request and payment of the necessary fee. The above and/or other aspects will become apparent and more readily appreciated from the following description of exemplary embodiments, taken in conjunction with the accompanying drawings of which.

DETAILED DESCRIPTION

Figure 1:
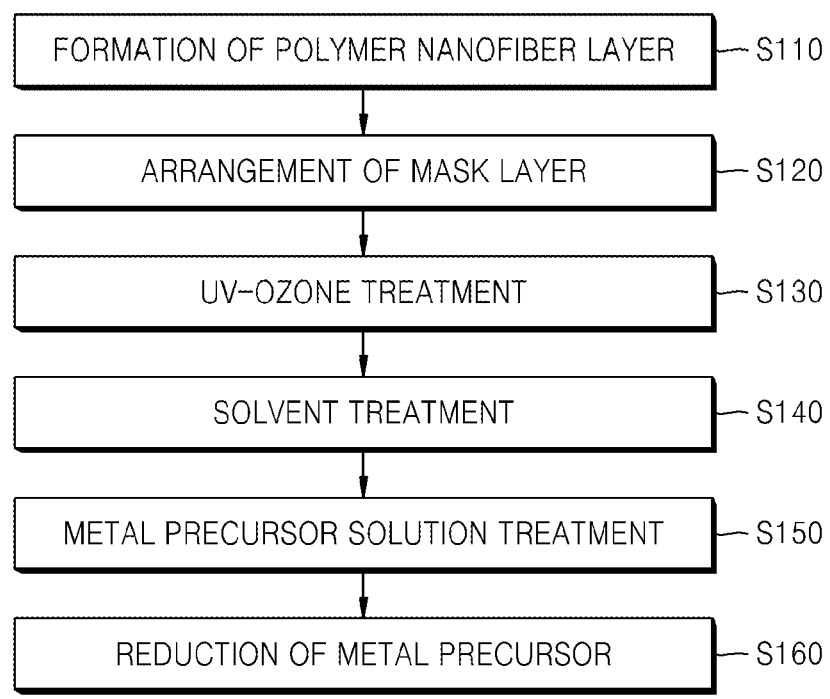
FIG. 1 shows a flowchart illustrating a method of forming a polymer nanofiber-metal nanoparticle composite pattern according to an exemplary embodiment.

Exemplary embodiments will now be described in detail with reference to the accompanying drawings, wherein like reference numerals refer to like elements throughout. In this regard, the present embodiments may take different forms and should not be construed as being limited to the descriptions set forth herein. As used herein, the term "and/or" includes any and all combinations of one or more of the associated listed items.

The term "nanofiber" as used herein refers to a fiber with a diameter in the range of from a few nanometers to a few micrometers.

The term "UV-ozone" as used herein refers to simultaneous UV irradiation and ozone supply. The ozone supply may include a conversion of oxygen into ozone via UV exposure.

FIG. 1 is a flowchart illustrating a method of forming a polymer nanofiber-metal nanoparticle composite pattern according to an exemplary embodiment.

Referring to FIG. 1, a polymer nanofiber layer is formed on a substrate (S110). The polymer nanofiber layer may be made from polymer nanofibers having a heterocycle containing a nitrogen atom. The heterocycle may be, for example, a heteroaryl group. The polymer may include a copolymer. The polymer may be oxidized by UV-ozone, and its solvent solubility may be different before and after oxidization. The polymer nanofiber layer may be formed by, for example, electrospinning, wet spinning, melt spinning, or solvent spinning processes.

A mask is disposed on the polymer nanofiber layer (S120). The mask has apertures having the same shape as that of the polymer nanofiber-metal nanoparticle composite pattern to be formed. The mask may include materials, such as a metal, which do not react with the UV-ozone.

The polymer nanofiber layer is exposed to UV-ozone via the aperture of the mask (S130). The part of the polymer nanofiber layer exposed via the aperture of the mask may be oxidized by ozone after receiving activation energy necessary for oxidization by UV.

The part of the polymer nanofiber layer not oxidized by UV-ozone is removed from the polymer nanofiber layer by dissolving it in a solvent (S140). The unoxidized part of the polymer nanofiber layer is removed based on the solubility difference between the oxidized part and unoxidized part. The solvent is used to dissolve the unoxidized part of the polymer nanofiber layer without dissolving the oxidized part. By removing the unoxidized part of the polymer nanofiber layer via selective dissolution, a polymer nanofiber layer pattern may be formed.

The polymer nanofiber layer pattern is treated with a metal precursor solution (S150). The metal precursor may include, for example, compounds of Ag, Au, Pt, Cu, Pd, or the like. The metal precursor may be uniformly distributed on the polymer nanofiber layer by immersing the polymer nanofiber layer into the metal precursor solution or by coating the metal precursor solution on the polymer nanofiber layer, for example. Subsequently, a polymer nanofiber-metal precursor composite may be formed via heat treatment, thereby forming a polymer nanofiber-metal precursor composite pattern.

The metal precursor of the polymer nanofiber-metal precursor composite pattern is reduced to a metal by treating it with a reducing agent (S160). For example, the metal precursor on the polymer nanofiber surface can be reduced to a metal nanoparticle by exposing the polymer nanofiber-metal precursor composite pattern to hydrazine ($N_2H_4$) gas or by immersing it in a sodium borohydride ($NaBH_4$) ethanol solution, thereby forming a polymer nanofiber-metal nanoparticle composite pattern. The density of the metal nanoparticles in the polymer nanofiber-metal nanoparticle composite pattern can be increased by repeating the steps of treating the polymer nanofiber layer pattern with the metal precursor solution (S150) and reducing the metal precursor into a metal (S160). Washing and drying may be additionally performed as necessary for each step.

FIGS. 2A through 2F are schematic drawings illustrating a method of forming polymer nanofiber-metal nanoparticle composite pattern according to an exemplary embodiment.

Figure 2A:
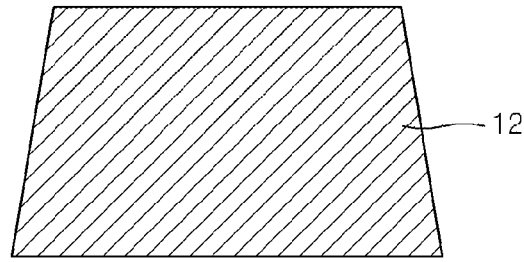
FIGS. 2A through 2F are schematic drawings illustrating a method of forming a polymer nanofiber-metal nanoparticle composite pattern according to an exemplary embodiment of the present disclosure.

Referring to FIG. 2A, a polymer nanofiber layer 12 is formed on a substrate (not shown). The substrate may include, for example, glass, plastic, textile, silicon, or semiconductor, but is not limited thereto. The substrate may have other constitutional features as necessary.

The polymer nanofiber in the polymer nanofiber layer 12 may include polymers having a heteroaryl group containing a nitrogen atom. The heteroaryl group containing a nitrogen atom may exhibit a characteristic in that the polymer may be insoluble in a solvent when the heteroaryl group is oxidized by UV-ozone. The polymer may be, for example, poly(4-vinylpyridine), poly(2-vinylpyridine), poly(4-vinylpyridinium) salt, poly(2-vinylpyridinium) salt, poly(4-vinyl-2-methylpyridine), or poly(2-vinyl-4-methylpyridine), but is not limited thereto. In addition, the polymer may be a copolymer. Furthermore, the polymer nanofiber may be an elastomeric polymer.

The diameter of the polymer nanofibers that form the polymer nanofiber layer 12 may be in the range of about a few nanometers to about a few micrometers. For example, the diameter of the polymer nanofiber may be in the range of about 1 nm to about 1 μm.

The polymer nanofiber layer 12 may be formed by electrospinning, wet spinning, melt spinning, or solvent spinning, but is not limited thereto. The polymer nanofiber layer may be formed so as to have a thickness in the range of about 10 to about 100 μm, or about 20 to about 60 μm.

For example, when electrospinning is used, the polymer may be dissolved in an appropriate solvent such as chloroform, chlorobenzene, toluene, dimethylformaldehyde, tetrahydrofuran, dimethyl sulfoxide, N-methylpyrrolidone, or Fluorinert™, thereby forming a polymer solution having a suitable viscosity. The polymer solution is filled into a cylinder of the electrospinning device, and a high voltage is applied to the nozzle of the cylinder while releasing the polymer solution into the nozzle at a constant rate. Then, droplets of the polymer solution are formed on the nozzle, and polymer nanofibers are formed from the droplets and deposited on a substrate (not shown), thereby forming the polymer nanofiber layer 12. The polymer nanofibers are mutually overlapped in the polymer nanofiber layer 12, thereby forming a texture.

The morphology and diameter of the polymer nanofiber may be controlled by controlling the molecular weight of the polymer, type of solvent, applied voltage, spinning distance, spinning temperature, spinning humidity, and the like.

Figure 2B:
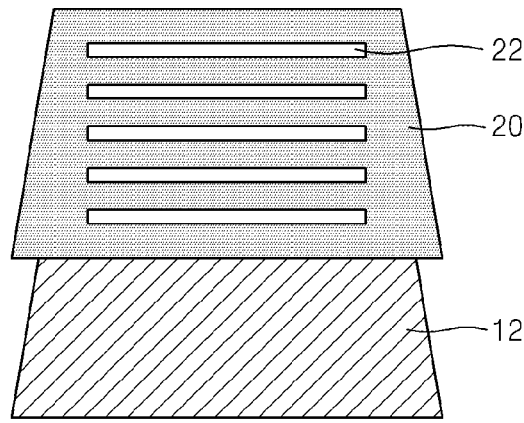

Referring to FIG. 2B, a mask is disposed on the polymer nanofiber layer 12. The mask 20 has apertures in the desired pattern shape. The mask 20 may be made from materials which do not react with UV-ozone. For example, the mask 20 may include a metal, glass, or the like, but is not limited thereto. If the mask 20 includes a metal, the metal may be nickel or the like, but is not limited thereto.

Figure 2C:
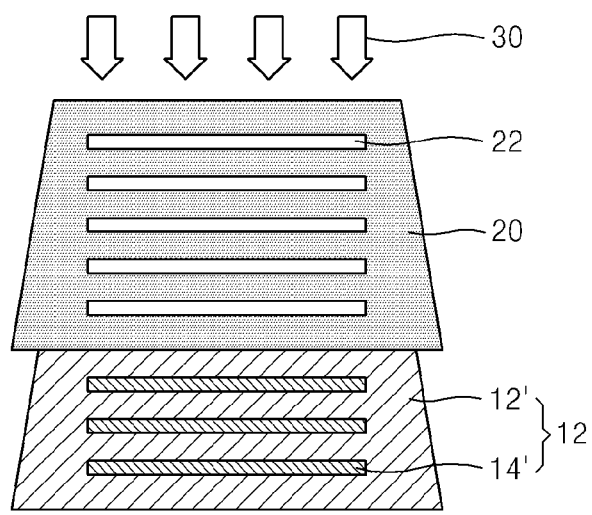

Referring to FIG. 2C, a polymer nanofiber layer 12 is exposed to UV-ozone 30 via an aperture 22 of the mask 20. Treatment with the UV-ozone 30 refers to a simultaneous treatment including UV irradiation and ozone supply, wherein a UV and ozone supply device or a UV and an oxygen supply device may be used. A UV lamp may be used to supply UV irradiation, and the ozone may be ozone plasma, but these are not limited thereto.

The part of the polymer nanofiber layer 12 exposed by the aperture 22 of the mask 20 may be oxidized by ozone after absorbing the activation energy from UV necessary for oxidation. For example, a nitrogen-containing heteroaryl cyclic group in the exposed portion of the polymer nanofiber layer 12 may be oxidized by UV-ozone treatment into a heterocyclic group having a ketone group. For example, in the case of a poly(4-vinylpyridine) polymer, the pyridyl group may be oxidized by UV-ozone treatment into a 2,5-dione-3,4-dihydropyridyl group. Accordingly, the polymer nanofiber layer 12 can be divided into an oxidized part 14' and an unoxidized part 12' via selective exposure to UV-ozone treatment 30.

The solubility of the oxidized polymer may be different from the unoxidized polymer. That is, the oxidized part 14' of the polymer nanofiber layer 12 after exposure to UV-ozone may have a solubility different from the unoxidized part 12'. This difference in solubility may be used to form a pattern in the polymer nanofiber layer.

Figure 2D:
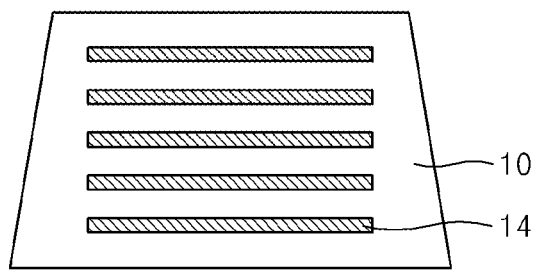

Referring to FIG. 2D, the unoxidized part 12' is removed from the polymer nanofiber layer 12 by dissolving it in a suitable solvent, for example, an alcohol. The solvent cannot dissolve the oxidized polymer of the polymer nanofiber layer 12. When the unoxidized part 12 is removed, a polymer nanofiber pattern 14 can be obtained therefrom.

Figure 2E:
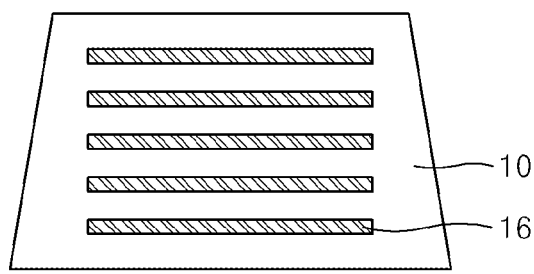

Referring to FIG. 2E, a polymer nanofiber pattern 14 is treated with a metal precursor solution. The metal precursor may include metal compounds, for example, compounds of Ag, Au, Pt, Cu, and Pd. For example, as the metal precursor, $AgNO_3$, $AgCl$, $HAuCl_4$, $CuCl_2$, $PtCl_2$, $PtCl_4$ or $PdCl_2$ may be used, but the metal precursor not limited thereto.

The metal precursor solution may be formed by dissolving the metal precursor in a solvent. The solvent may include, for example, water, ethanol, or isopropyl alcohol.

The metal precursor may be uniformly distributed over the polymer nanofiber pattern 14 by methods such as immersing the polymer nanofiber pattern 14 into the metal precursor solution or coating the metal precursor solution over the polymer nanofiber pattern 14. Heat treatment can be performed thereafter, thereby forming a complex compound of the polymer nanofiber pattern 14 and the metal precursor. The heat treatment may be performed at a temperature of from 100-140° C. As such, a polymer nanofiber-metal precursor composite pattern 16, where a metal precursor is deposited on the surface of the polymer nanofiber pattern, can be formed. The nitrogen in the hetero cyclic group of the polymer nanofiber may bind to the metal precursor, but the binding mechanism between the polymer fiber and the metal precursor is not limited thereto.

Figure 2F:
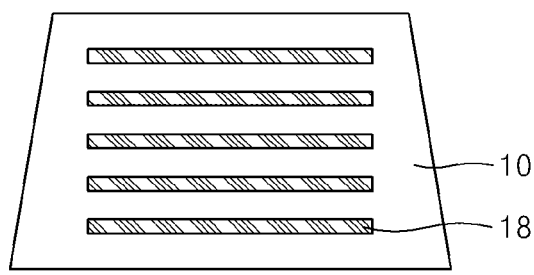

Referring to FIG. 2F, a polymer nanofiber-metal nanoparticle composite pattern 18 may be formed on the substrate 10 by reducing the metal precursor of the polymer nanofiber-metal precursor composite pattern 16 into a metal. The reducing agent may include hydrazine or hydrazine hydrate, sodium borohydride, formic acid, oxalic acid, ascorbic acid, or lithium aluminum hydride, but is not limited thereto.

For example, the metal precursor on the surface of the polymer nanofiber may be reduced into a metal nanoparticle by exposing the polymer nanofiber-metal precursor composite pattern 16 to hydrazine ($N_2H_4$) gas or immersing it in a sodium borohydride ($NaBH_4$) ethanol solution, thereby forming a polymer nanofiber-metal nanoparticle composite pattern 18.

In addition, by repeating the steps of treating the polymer nanofiber pattern 14 with a metal precursor solution (FIG. 2E) and reducing the metal precursor into a metal (FIG. 2F), the density of metal nanoparticles in the polymer nanofiber-metal nanoparticle composite pattern 18 may be increased.

Furthermore, the polymer nanofiber-metal nanoparticle composite pattern described in the following examples may be used in electronic devices, biosensors, chemical sensors, cell incubators, tissue engineering bioreactors, wearable devices, electrodes, sensors, wirings in energy generators and storage devices, and the like.

Experimental Example 1

P4VP (poly(4-vinylpyridine)) (weight average molecular weight of 160,000) was dissolved in DMF(N,N-dimethylformamide) (30 wt % relative to the total weight) and a P4VP polymer solution was obtained. The P4VP polymer solution was electrospun on a silicon wafer covered with a silicon oxide, and a P4VP nanofiber layer having a thickness of about 2.5 μm and consisting of nanofibers having a diameter in the range of about 150 nm to about 400 nm was obtained.

Experimental Example 2

The P4VP nanofiber layer obtained by the method in Experimental Example 1 was exposed to UV-ozone (28 $mW/cm^2$) (UVO cleaner, AHTECH LTS) for 10 minutes, and then dried in vacuum for about 12 hours.

Experimental Example 3

The P4VP nanofiber layer obtained by the method in Experimental Example 2 was immersed in an aqueous $HAuCl_4$ solution (0.02M), and then taken out. The resulting P4VP nanofiber layer was washed with deionized water. The $HAuCl_4$ that did not react with the P4VP nanofiber layer was washed with deionized water. $HAuCl_4$ which did react to the P4VP nanofiber layer was reduced to Au by using a hydrazine hydrate ($N_2H_4.3H_2O$) gas, thereby obtaining a P4VP nanofiber-Au nanoparticle composite layer.

Experimental Examples 4-7

P4VP nanofiber-Au nanoparticle composite layer were formed using the same method as in Experimental Example 3 except that the thicknesses of the polymer nanofiber layers were 5, 10, 15, and 20 μm, respectively.

Experimental Example 8

A P4VP nanofiber-Au nanoparticle composite layer was formed using the same method as in Experimental Example 3 except that the steps of $HAuCl_4$ solution treatment and reduction using hydrazine hydrate gas were each performed twice instead of once.

Experimental Examples 9-12

P4VP nanofiber-Au nanoparticle composite layers were formed using the same method as in Experimental Example 8 except that the thicknesses of the polymer nanofiber layers were 5, 10, 15, and 20 μm, respectively.

Experimental Example 13

A P4VP nanofiber-Au nanoparticle composite layer was formed using the same method as in Experimental Example 3 except that the steps of $HAuCl_4$ solution treatment and reduction were each performed three times instead of once.

Experimental Examples 14-17

P4VP nanofiber-Au nanoparticle composite layers were formed using the same method as in Experimental Example 13 except that the thicknesses of the polymer nanofiber layers were 5, 10, 15, and 20 μm, respectively.

Experimental Example 18

A P4VP nanofiber-Au nanoparticle composite layer was formed using the same method as in Experimental Example 3 except that the steps of $HAuCl_4$ solution treatment and reduction were each performed four times instead of once.

Experimental Examples 19-22

P4VP nanofiber-Au nanoparticle composite layers were formed using the same method as in Experimental Example 18 except that the thicknesses of the polymer nanofiber layers were 5, 10, 15, and 20 μm, respectively.

Experimental Examples 23-36

P4VP nanofiber-Au nanoparticle composite layers were formed using the same method as in Experimental Example 8 except that a heat treatment was performed after each of the first and the second reductions. The heat treatment was performed in Experimental Examples 23-36 from 70° C. to 200° C. at 10° C. intervals, respectively.

Experimental Examples 37-50

A P4VP nanofiber-Au nanoparticle composite layer was formed using the same method as in Experimental Example 13 except that heat treatment was performed after each of the first to third reductions. The heat treatment was performed in Experimental Examples 37-50 from 70° C. to 200° C. at 10° C. intervals, respectively.

The number of reductions and the temperature of the heat treatment after the reduction of the P4VP nanofiber-Au nanoparticle composite layer in Experimental Examples 23-50 are shown in Table 1 below.

Fourier transform infrared spectroscopy (FT-IR) spectrum

Figure 3:
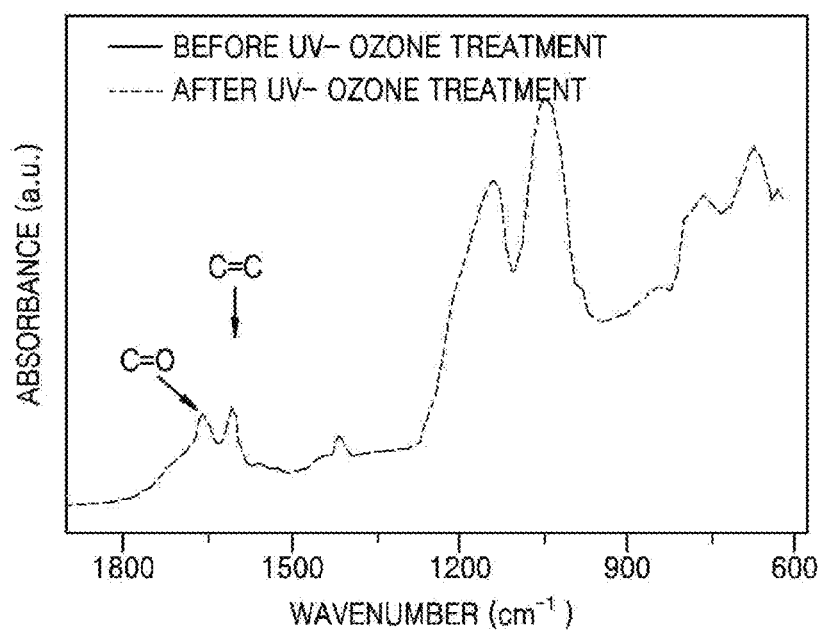
FIG. 3 shows the Fourier transform infrared spectroscopy (FT-IR) spectra of the P4VP nanofiber layers of Experimental Example 1 and Experimental Example 2.
Figures 4A, 4B, 4C, 4D:
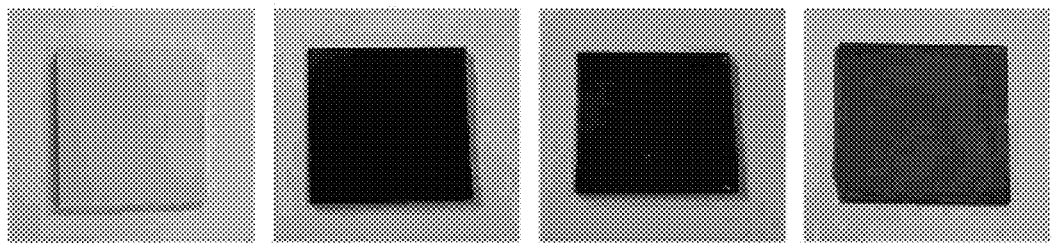
FIGS. 4A through 4D are optical microscope pictures of the P4VP nanofiber layers of Experimental Examples 1 through 4, respectively.

FIG. 3 shows the FT-IR spectra of the P4VP nanofiber layers of Experimental Example 1 and Experimental Example 2.

Referring to FIG. 3, the FT-IR spectrum of the P4VP nanofiber layer before UV-ozone treatment in Experimental Example 1 shows a carbon-carbon double bond (C=C) peak (1598.9 $cm^{-1}$). In contrast, the FT-IR spectrum of the P4VP nanofiber layer after the UV-ozone treatment in Experimental Example 2 shows a decrease in the carbon-carbon double bond (C=C) peak, while showing a carbonyl (C=O) peak (1651.0 $cm^{-1}$). From this, it was speculated that a part of the carbon-carbon double bond of the pyridyl group in the P4VP nanofiber was oxidized into a carbonyl group by the UV-ozone treatment.

Optical Microscope Pictures

FIGS. 4A through 4D are optical microscope pictures of the P4VP nanofiber layers of Experimental Examples 1 through 4, respectively. Referring to the pictures in FIG. 4A through 4D, the P4VP nanofiber layer of Experimental Example 1 before UV-ozone treatment had a yellow color (FIG. 4A), whereas the P4VP nanofiber layers containing Au after UV-ozone treatment of Experimental Examples 2-4 (P4VP nanofiber-Au nanoparticle composite layer) (FIGS. 4B-4D) showed colors in the range of black to dark brown. In particular, as the number of Au precursor treatment and reductions increased, the surface of the P4VP nanofiber layers increasingly showed a predominantly brown color, which denotes an increase in the Au content in the P4VP nanofiber layers.

Measurement of Resistivity

Figure 5:
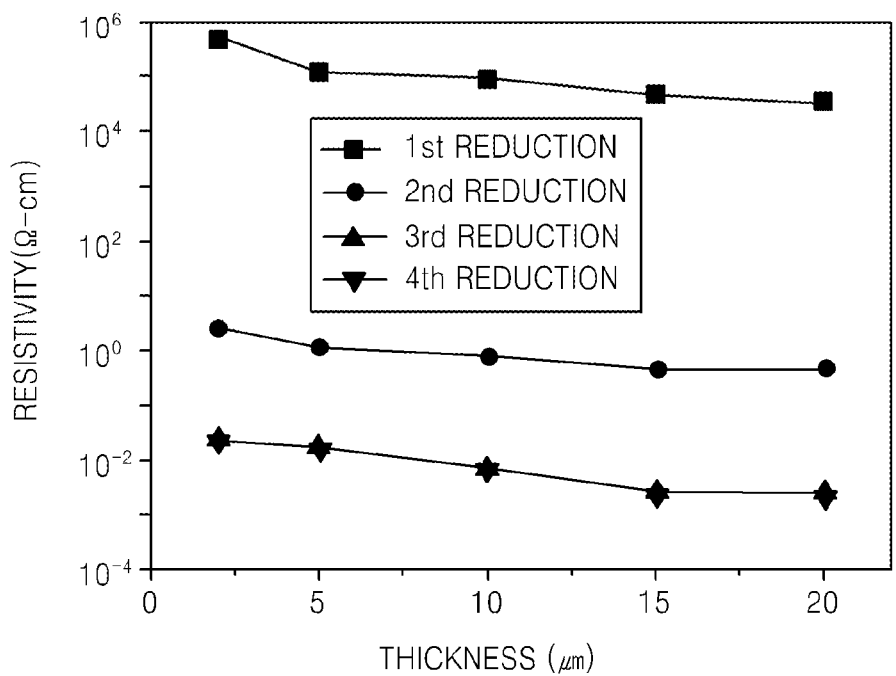
FIG. 5 is a graph illustrating the thickness resistivity of the P4VP nanofiber-Au nanoparticle composite layers of Experimental Examples 3-22.

FIG. 5 is a graph illustrating the resistivity of the P4VP nanofiber-Au nanoparticle composite layers of Experimental Examples 3-22 according to the layer thickness. Referring to the graph in FIG. 5, as the number of Au precursor treatment and reductions (indicated as $1^{st}$-$4^{th}$ reduction) increased from one to three times, the resistivity of the polymer nanofiber-

TABLE 1

| | Experimental Example | | | | | | |
|---|---|---|---|---|---|---|---|
| | 23 | 24 | 25 | 26 | 27 | 28 | 29 |
| Reduction | 2 times | 2 times | 2 times | 2 times | 2 times | 2 times | 2 times |
| Heat Treatment | 70° C. | 80° C. | 90° C. | 100° C. | 110° C. | 120° C. | 130° C. |

| | Experimental Example | | | | | | |
|---|---|---|---|---|---|---|---|
| | 30 | 31 | 32 | 33 | 34 | 35 | 36 |
| Reduction | 2 times | 2 times | 2 times | 2 times | 2 times | 2 times | 2 times |
| Heat Treatment | 140° C. | 150° C. | 160° C. | 170° C. | 180° C. | 190° C. | 200° C. |

| | Experimental Example | | | | | | |
|---|---|---|---|---|---|---|---|
| | 37 | 38 | 39 | 40 | 41 | 42 | 43 |
| Reduction | 3 times | 3 times | 3 times | 3 times | 3 times | 3 times | 3 times |
| Heat Treatment | 70° C. | 80° C. | 90° C. | 100° C. | 110° C. | 120° C. | 130° C. |

| | Experimental Example | | | | | | |
|---|---|---|---|---|---|---|---|
| | 44 | 45 | 46 | 47 | 48 | 49 | 50 |
| Reduction | 3 times | 3 times | 3 times | 3 times | 3 times | 3 times | 3 times |
| Heat Treatment | 140° C. | 150° C. | 160° C. | 170° C. | 180° C. | 190° C. | 200° C. | metal nanoparticle composite layer decreased. However, when the number of Au precursor treatment and reductions was four times, the resistivity was the same as that when the number of Au precursor treatment and reductions was three times, and this result was speculated to be due to obtaining a saturated density of Au on the P4VP nanofiber. In addition, in FIG. 5, as the thickness of the P4VP nanofiber-Au nanoparticle composite layer increased from 2.5 μm to 20 μm, the resistivity decreased.

Figure 6:
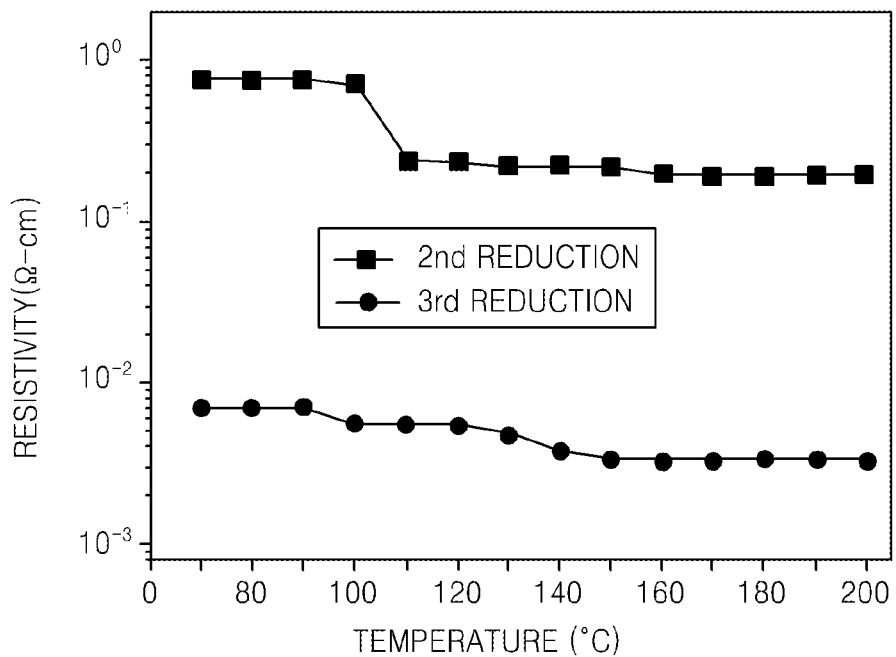
FIG. 6 is a graph illustrating the temperature resistivity of the P4VP nanofiber-Au nanoparticle composite layers of Experimental Examples 23-50.

FIG. 6 is a graph illustrating the temperature resistivity of the P4VP nanofiber-Au nanoparticle composite layers of Experimental Examples 23-50. Heat treatment was performed after reduction treatment and the temperature of the heat treatment was increased from 70° C. to 200° C. at 10° C. intervals.

Referring to the graph in FIG. 6, when the number of Au precursor treatment and reductions was two times (Experimental Examples 23-36; indicated as the $2^{nd}$ reduction), the resistivity decreased when the heat treatment was 110° C., whereas there was no observable difference in resistivity when the heat treatment was performed at a temperature higher than 110° C. In addition, in FIG. 6, when the number of Au precursor treatment and reductions was three times (Experimental Examples 37-50; indicated as the $3^{rd}$ reduction), the resistivity slightly decreased as the heat treatment temperature increased up to 150° C., whereas there was no observable difference in resistivity when the heat treatment was performed at a temperature higher than 150° C.

Example 1

A nickel (Ni) mask having a plurality of apertures with a linear width of 30 μm was disposed on the P4VP nanofiber layer obtained by the method in Experimental Example 1. The P4VP nanofiber layer with the nickel mask was exposed to UV-ozone for 10 minutes by placing it into a UVO device (AHTECH LTS). After the UV-ozone treatment, the P4VP nanofiber layer was taken out of the UVO device and the nickel mask was removed. Then, the P4VP nanofiber layer was washed with ethanol to selectively remove the part of the P4VP nanofiber layer which was not exposed to the UV-ozone, thereby forming a P4VP nanofiber layer pattern. Subsequently, the P4VP nanofiber layer pattern was immersed in an aqueous $HAuCl_4$ solution (0.02M) and washed with deionized water. Then, the $HAuCl_4$ that was combined with the P4VP nanofiber layer pattern was reduced to Au by flowing a hydrazine hydrate ($N_2H_4 \cdot 3H_2O$) gas into the P4VP nanofiber layer pattern thereon, and a P4VP nanofiber-Au nanoparticle composite pattern was formed.

Example 2

A P4VP nanofiber-Au nanoparticle composite pattern was formed using the same method as in Example 1 except that $HAuCl_4$ solution treatment and reduction were performed twice instead of once.

Example 3

A P4VP nanofiber-Au nanoparticle composite pattern was formed using the same method as in Example 1 except that $HAuCl_4$ solution treatment and reduction were performed three times instead of once.

Scanning Electron Microscopy (SEM) Pictures

Figure 7A:
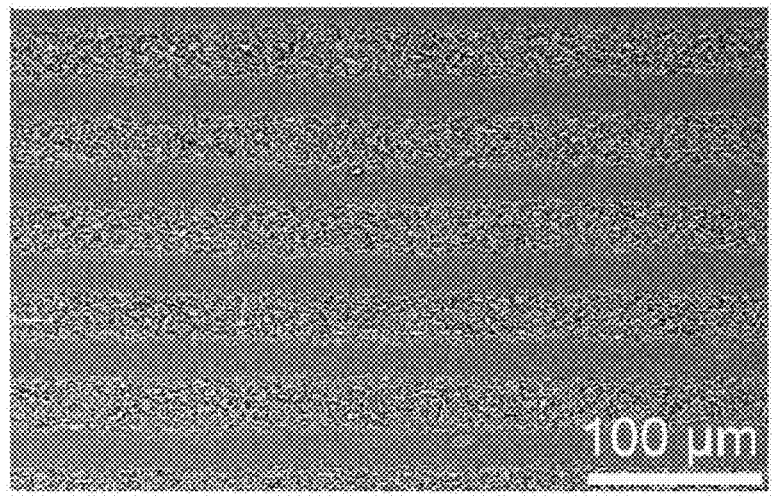
FIG. 7A is a picture taken via scanning electron microscopy (SEM) of the P4VP nanofiber-Au nanoparticle composite pattern formed in Example 1.
Figure 7B:
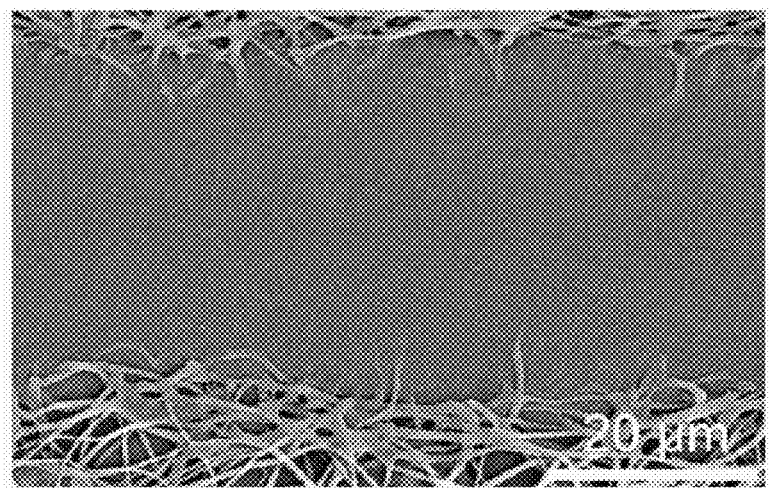
FIG. 7B is an enlarged picture of the P4VP nanofiber-Au nanoparticle composite pattern of FIG. 7A.

FIG. 7A is a picture taken via SEM of the P4VP nanofiber-Au nanoparticle composite pattern formed in Example 1, and FIG. 7B is an enlarged picture of the P4VP nanofiber-Au nanoparticle composite pattern of FIG. 7A. Referring to the picture in FIG. 7A, it was confirmed that a P4VP nanofiber-Au nanoparticle composite pattern with a linear width of 30 μm was formed. In addition, in FIG. 7B, it was confirmed that the P4VP nanofiber pattern was clearly removed between P4VP nanofiber-Au nanoparticle composite patterns.

Transmission Electron Microscopy (TEM) Pictures

Figure 8A:
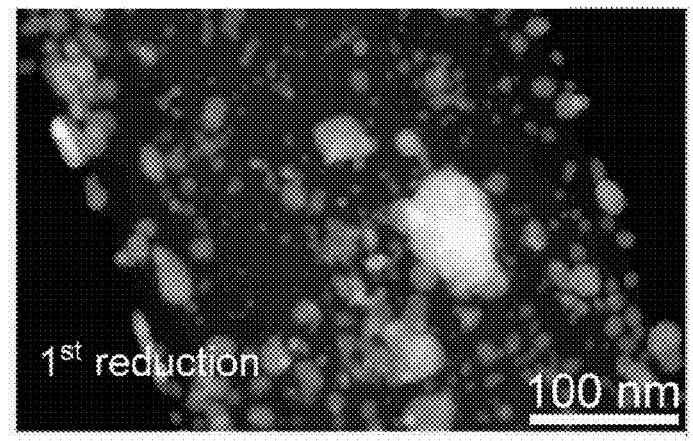
FIGS. 8A through 8C are pictures taken via tunneling electron microscopy (TEM) of the P4VP nanofiber-Au nanoparticle composite patterns formed in Examples 1-3, respectively.
Figure 8B:
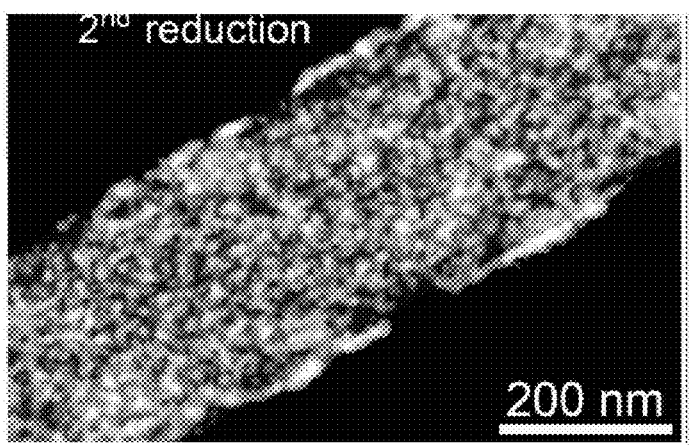
Figure 8C:
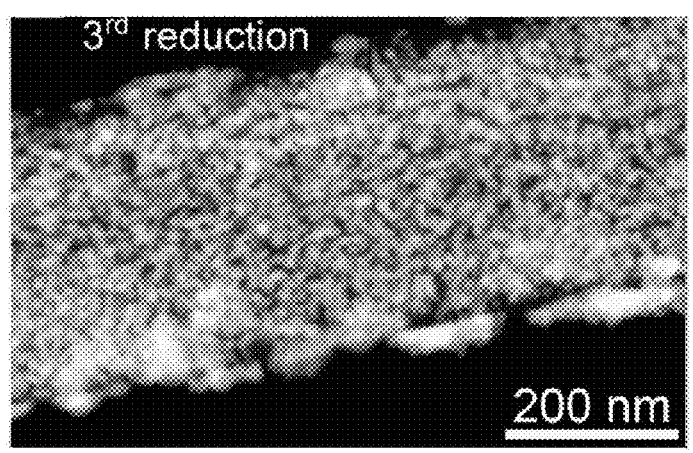

FIGS. 8A through 8C are pictures taken via TEM of P4VP nanofiber-Au nanoparticle composite patterns formed in Examples 1-3, respectively. In FIGS. 8A through 8C, the bright portions of the figures represent Au nanoparticles. It was confirmed from the pictures of FIGS. 8A through 8C that as the number of Au precursor treatment and reductions was increased (from one in FIG. 8A to three in FIG. 8C), the density of Au on the P4VP nanofiber increased.

Example 4

Strain Sensor

A strain sensor to identify the strained state including the level of strain was formed as follows. A P4VP fiber-Au nanoparticle composite layer with a thickness of about 20 μm was formed on a bendable polyethylene terephthalate (PET) substrate using the method of Experimental Example 8. The Au precursor treatment and reduction using a hydrazine hydrate gas were each performed two times. A polystyrene (PS) pattern was formed on the P4VP fiber-Au nanoparticle composite layer using an injection nozzle. Subsequently, Au precursor treatment and reduction using a hydrazine hydrate gas were performed on the P4VP fiber-Au nanoparticle composite layer on which the polystyrene pattern was formed.

Figure 9:
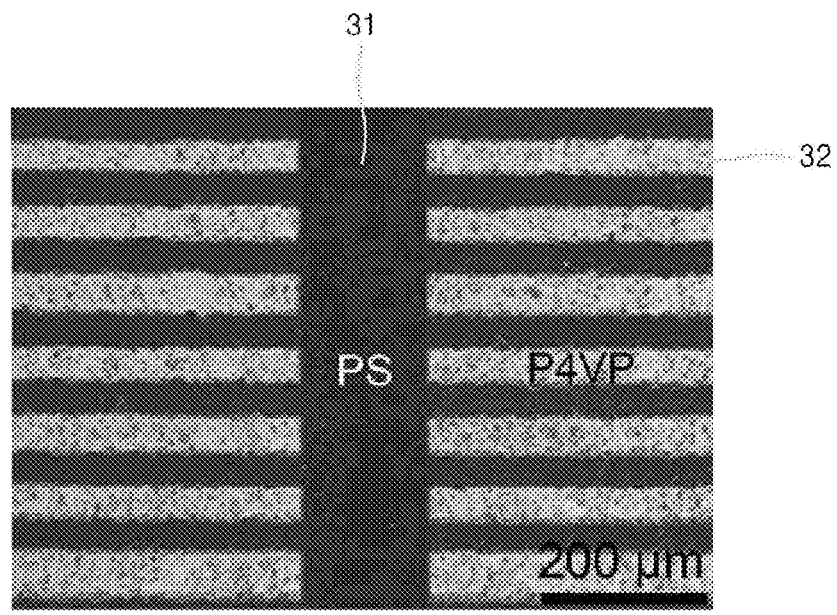
FIG. 9 is a picture taken via scanning electron microscopy (SEM) of a strain sensor according to an exemplary embodiment.

FIG. 9 is a picture taken via SEM of a strain sensor formed as presented above. The dark part in the picture indicates where the polystyrene pattern was formed, serving as a tension detecting part 31 to detect a level of strain. The light part in the picture indicates where the polystyrene pattern was not formed and corresponds to a wiring part 32 to which electrodes (not shown) are connected. In the tension detecting part 31, Au precursor treatment and reduction using a hydrazine hydrate gas was performed two times, and in the wiring part 32, it was performed three times.

When the tension detecting part 31 is bent or folded, the P4VP nanofiber becomes strained and the distance between Au nanoparticles on the P4VP nanofiber increases, thus lowering the electrical conductivity of the P4VP nanofiber. When the bent or folded tension detecting part 31 is straightened or unfolded, the P4VP nanofiber is released from the previously applied tension and the distance between Au nanoparticles on the P4VP nanofiber decreases, thereby increasing the electrical conductivity of the P4VP nanofiber. Accordingly, the strained state of a P4VP nanofiber may be identified by measuring the resistivity thereof. In addition, because the density of Au nanoparticles in the wiring part 32 is relatively high, there is no observable difference in the electrical conductivity of the P4VP nanofiber of the P4VP nanofiber due to the presence of tension.

Figure 10:
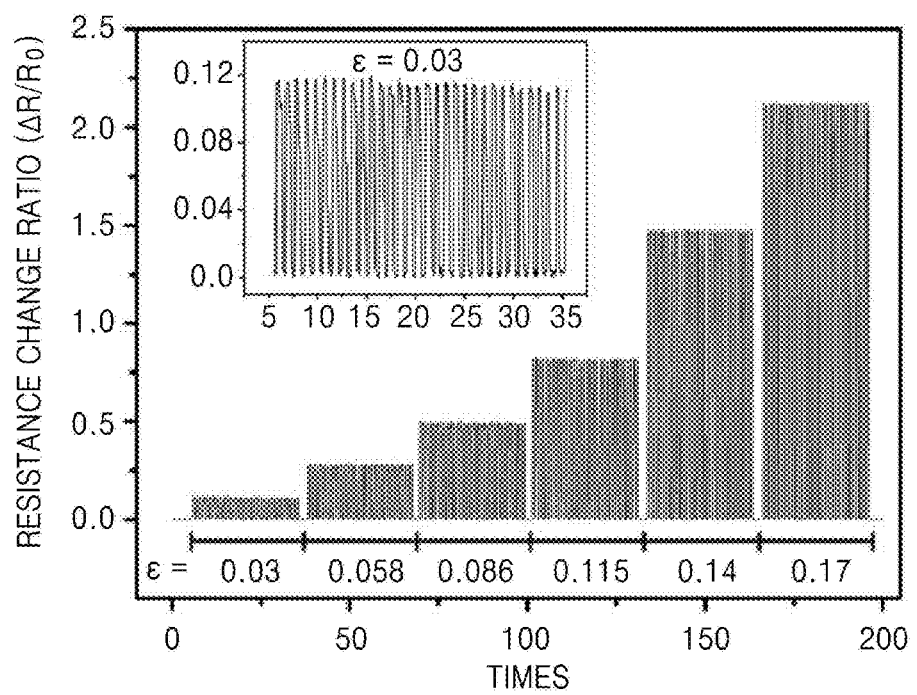
FIG. 10 is a graph illustrating the strain ratio resistivity of the strain sensor of FIG. 9.

FIG. 10 is a graph illustrating the resistivity of the strain sensor of FIG. 9 according to its strain ratio. In FIG. 10, a strain sensor was elongated an equal number of times (30 times) per each strain ratio and the change in resistance was measured. In FIG. 10, $\epsilon$ indicates an strain ratio ($\epsilon = \Delta l/l$) between the difference in the polymer nanofiber length before and after the elongation ($\Delta l$) and the length of the nanofiber before the elongation. In FIG. 10, the Y axis indicates a resistance change ratio ($\Delta R/R_0$), that is, a resistance change before and after elongation ($\Delta R$) and the resistance before elongation ($R_0$). Referring to FIG. 10, it is apparent that the resistance change rate is small at a low elongation rate, while the resistance change rate is high at a high elongation rate, thus confirming that the strain sensor in FIG. 9 is capable of detecting the strained state very well. The strain sensor may be used, for example, in detecting the bending level of the joints of a robotic arm.

According to the exemplary embodiments, a patterned polymer nanofiber layer may be formed by selectively exposing a polymer nanofiber layer to UV-ozone irradiation via a mask pattern, and then selectively removing the part not oxidized by UV-ozone irradiation from the polymer nanofiber layer. A polymer nanofiber-metal nanoparticle composite pattern may be formed by forming a composite between a polymer fiber having a polymer nanofiber layer pattern and a metal precursor, and then reducing the metal precursor to a metal.

It should be understood that the exemplary embodiments described herein should be considered as being descriptive only and do not limit the present disclosure. Descriptions of features or aspects within each embodiment should typically be considered as being available for other similar features or aspects in other embodiments.

What is claimed is:

1. A method of forming a polymer nanofiber-metal nanoparticle composite pattern, the method comprising:
    forming on a substrate a polymer nanofiber layer comprising polymer nanofibers made from polymers comprising a heteroaryl group;
    selectively exposing to UV-ozone a part of the polymer nanofiber layer through an aperture of a mask;
    selectively removing a part of the polymer nanofiber layer which was not exposed to UV-ozone from the polymer nanofiber layer to form a polymer nanofiber layer pattern;
    depositing a metal precursor on the polymer nanofiber layer pattern; and
    reducing the metal precursor into a metal.

2. The method of claim 1, wherein the heteroaryl group contains a nitrogen atom.

3. The method of claim 1, wherein the polymers comprising the heteroaryl group comprise poly(4-vinylpyridine), poly(2-vinylpyridine), poly(4-vinylpyridinium) salt, poly(2-vinylpyridinium) salt, poly(4-vinyl-2-methylpyridine), or poly(2-vinyl-4-methylpyridine).

4. The method of claim 1, wherein the polymer nanofibers are an elastomeric polymer.

5. The method of claim 1, wherein the polymer nanofiber layer is formed by electrospinning, wet spinning, melt spinning, or solvent spinning.

6. The method of claim 1, wherein a diameter of the polymer nanofiber is in a range of about 1 nm to about 1 μm.

7. The method of claim 1, wherein the thickness of the polymer nanofiber layer is in a range of from about 10 μm to about 100 μm.

8. The method of claim 1, wherein the part of the polymer nanofiber layer that is exposed to the UV-ozone becomes oxidized by the UV-ozone and comprises a carbonyl group.

9. The method of claim 1, wherein the selectively removing the part of the polymer nanofiber layer which was not exposed to UV-ozone from the polymer nanofiber layer comprises selectively dissolving the part of the polymer nanofiber layer which was not exposed to UV-ozone in a solvent.

10. The method of claim 1, wherein the solvent comprises an alcohol.

11. The method of claim 1, wherein the depositing the metal precursor on the polymer nanofiber layer pattern comprises:
    forming a metal precursor solution by dissolving the metal precursor in a solvent; and
    immersing the polymer nanofiber layer pattern in the metal precursor solution.

12. The method of claim 1, wherein the depositing the metal precursor on the polymer nanofiber layer pattern comprises:
    forming a metal precursor solution by dissolving the metal precursor in a solvent; and
    coating the metal precursor solution on the polymer nanofiber layer pattern.

13. The method of claim 11, wherein the metal precursor comprises $AgNO_3$, $AgCl$, $HAuCl_4$, $CuCl_2$, $PtCl_2$, $PtCl_4$ or $PdCl_2$.

14. The method of claim 11, wherein the metal precursor forms a complex ion with a polymer in the polymer nanofiber layer.

15. The method of claim 14, wherein the metal precursor binds to a nitrogen atom in the polymer.

16. The method of claim 1, wherein reducing the metal precursor into a metal is performed by using a reducing agent.

17. The method of claim 16, wherein the reducing agent comprises hydrazine, hydrazine hydrate, sodium borohydride, formic acid, oxalic acid, ascorbic acid, or lithium aluminum hydride.

18. The method of claim 17, wherein the reducing the metal precursor into a metal comprises exposing the polymer nanofiber to a hydrazine gas.

19. The method of claim 1, further including a heat treatment after depositing the metal precursor on the polymer nanofiber layer pattern and reducing the metal precursor into a metal.

20. The method of claim 19, wherein the heat treatment is performed between about 100° C. and about 140° C.

* * * * *